United States Patent
Tseng et al.

(10) Patent No.: US 9,859,282 B1
(45) Date of Patent: Jan. 2, 2018

(54) SEMICONDUCTOR STRUCTURE

(71) Applicant: UNITED MICROELECTRONICS CORP., Hsinchu (TW)

(72) Inventors: Chun-Yen Tseng, Tainan (TW); Ching-Cheng Lung, Tainan (TW); Yu-Tse Kuo, Tainan (TW); Chun-Hsien Huang, Tainan (TW); Shu-Ru Wang, Taichung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/280,333

(22) Filed: Sep. 29, 2016

(30) Foreign Application Priority Data

Aug. 30, 2016 (CN) .......................... 2016 1 0768268

(51) Int. Cl.
*H01L 27/108* (2006.01)
*H01L 29/78* (2006.01)

(52) U.S. Cl.
CPC .............................. *H01L 27/10805* (2013.01)

(58) Field of Classification Search
CPC ........... H01L 27/10805; H01L 27/0207; H01L 27/10891; H01L 27/10876; H01L 27/10814; H01L 27/10885; H01L 27/10823; H01L 27/10888; H01L 29/4236
USPC .................... 257/68–71, 296–309, 905–908, 257/E27.084–E27.097, E27.075, 257/E21.646–E21.66
See application file for complete search history.

(56) References Cited

U.S. PATENT DOCUMENTS

| 5,747,844 | A | | 5/1998 | Aoki et al. |
| 5,942,777 | A | * | 8/1999 | Chang ............... H01L 27/10805 257/296 |
| 5,959,321 | A | * | 9/1999 | Lee ................... H01L 27/10805 257/296 |
| 6,339,239 | B1 | | 1/2002 | Alsmeier et al. |
| 7,139,184 | B2 | * | 11/2006 | Schloesser ............. G11C 5/063 257/E21.659 |
| 8,519,462 | B2 | * | 8/2013 | Wang ................ H01L 27/10814 257/298 |
| 8,952,437 | B2 | | 2/2015 | Wang et al. |

FOREIGN PATENT DOCUMENTS

EP 0967652 A1 12/1999

* cited by examiner

*Primary Examiner* — Jonathan Han
(74) *Attorney, Agent, or Firm* — WPAT, PC

(57) ABSTRACT

A high-density semiconductor structure includes a substrate, a bit line and a first memory unit. The bit line, disposed on the substrate, has a first side and a second side. The first memory unit includes a first transistor, a first capacitor, a second transistor and a second capacitor. The first transistor disposed on the substrate has a first terminal and a second terminal. The first terminal connects the bit line. The first capacitor connects the second terminal of the first transistor. The second transistor disposed on the substrate has a third terminal and a fourth terminal. The third terminal connects the bit line. The second capacitor connects the fourth terminal of the second transistor. The first capacitor and the second capacitor are separated from the bit line in a direction perpendicular to an extending direction of the bit line and located on the first side of the bit line.

8 Claims, 3 Drawing Sheets

SEMICONDUCTOR STRUCTURE

This application claims the benefit of People's Republic Of China application Serial No. 201610768268.9, filed Aug. 30, 2016, the subject matter of which is incorporated herein by reference.

BACKGROUND OF THE INVENTION

Field of the Invention

The invention relates in general to a semiconductor structure, and more particularly to a high-density semiconductor structure with special layout of memory units.

Description of the Related Art

Along with the integration of semiconductor dynamic random access memory (DRAM) device, the layout and structure of a memory cell array suitable for highly integrated DRAM device have been provided. For the purpose to make a DRAM device to have a higher density, a DRAM memory unit has been successfully downsized to submicron level, meanwhile the capacitor of the memory unit is also downsized, and the signal-to-noise ratio (S/N) can be reduced, and the refresh rate and device errors can be increased due to the shrinkage of the capacitor.

Therefore, the memory units need to be densely arranged in a minimal space, such that feature spacing can be maintained or increased and the use of silicon surface area can be reduced.

SUMMARY OF THE INVENTION

The invention is directed to a semiconductor structure capable of providing a high-density memory unit array through the change in the arrangement of semiconductor structure transistors.

According to one embodiment of the present disclosure, a semiconductor structure is provided. The semiconductor structure includes a substrate, a bit line and a first memory unit. The bit line is disposed on the substrate and has a first side and a second side opposite to the first side. The first memory unit includes a first transistor, a first capacitor, a second transistor and a second capacitor. The first transistor is disposed on the substrate and has a first terminal and a second terminal, wherein the first terminal connects the bit line. The first capacitor connects to the second terminal of the first transistor. The second transistor is disposed on the substrate and has a third terminal and a fourth terminal, wherein the third terminal connects to the bit line. The second capacitor connects to the fourth terminal of the second transistor. The first capacitor and the second capacitor are separated from the bit line in a direction perpendicular to an extending direction of the bit line, and are located on the first side of the bit line.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
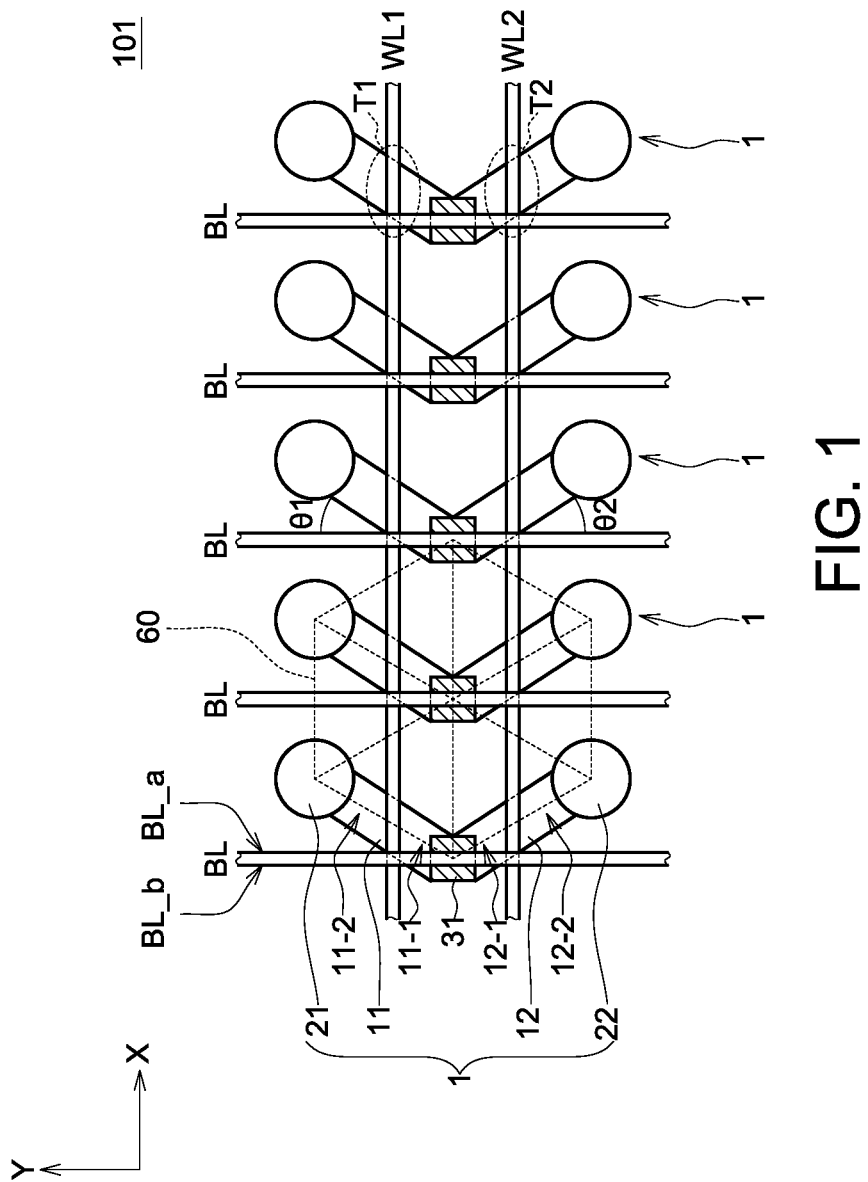
FIG. 1 is a top view of a semiconductor structure according to an embodiment of the invention.

A number of embodiments of the present disclosure are disclosed below with reference to accompanying drawings. However, the structure and content disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the invention will be able to make suitable modifications or changes based on the specification disclosed below to meet actual needs without breaching the spirit of the invention. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

FIG. 1 is a top view of a semiconductor structure 101 according to an embodiment of the invention. It should be noted that to more clearly illustrate the features and relationship between some elements of the semiconductor structure 101, some other elements may be omitted.

As indicated in FIG. 1, the semiconductor structure 101 includes a substrate (not illustrated), a bit line BL and a first memory unit 1. The bit line BL is disposed on the substrate and has a first side BL_a and a second side BL_b opposite to the first side BL_a. The first memory unit 1 includes a first transistor T1, a first capacitor 21, a second transistor T2 and a second capacitor 22. The first transistor T1 is disposed on the substrate and has a first terminal 11-1 and a second terminal 11-2, wherein the first terminal 11-1 connects to the bit line BL. The first capacitor 21 connects to the second terminal 11-2 of the first transistor T1. The second transistor T2 is disposed on the substrate and has a third terminal 12-1 and a fourth terminal 12-2, wherein the third terminal 12-1 connects to the bit line BL. The second capacitor 22 connects to the fourth terminal 12-2 of the second transistor T2.

In the present embodiment, the first capacitor 21 and the second capacitor 22 are separated from the bit line BL in a direction perpendicular to the extending direction of the bit line BL. Besides, both the first capacitor 21 and the second capacitor 22 are located on the first side BL_a of the bit line BL. That is, the active regions of the first transistor T1 and the second transistor T2 can be connected with each other and form a "<" shaped structure.

In an embodiment, the semiconductor structure 101 may further include a first bit line contact 31 disposed on the bit line BL. The first terminal 11-1 of the first transistor T1 and the third terminal 12-1 of the second transistor T2 are connected to the first bit line contact 31.

In the present embodiment of the invention, the semiconductor structure 101 may further include a plurality of word lines extended in a direction perpendicular to the extending direction of the bit line BL. For example, the plurality of word lines extend in the X direction of FIG. 1 and include a first word line WL1 and a second word line WL2. As indicated in FIG. 1, the active region of the first memory unit 1 can be divided into a first active region 11 and a second active region 12. The first word line WL1 is disposed on the first active region 11 to define the first transistor T1. The second word line WL2 is disposed on the second active region 12 to define the second transistor T2.

In the embodiment illustrated in FIG. 1, the bit line BL extends in the Y direction, and the first capacitor 21 and the second capacitor 22 are separated from the bit line BL in the X direction. That is, the first active region 11 and the bit line BL can form an angle θ1. Similarly, the second active region 12 and the bit line BL form an angle θ2. In the present embodiment, the angle θ1 and the angle θ2 can be the same, but it is not limited to this regards. In some embodiments, depending on design needs, the angle θ1 formed between the first active region 11 and the bit line BL can be different from the angle θ2 formed between second active region 12 and the bit line BL.

As indicated in FIG. 1, the semiconductor structure 101 includes a plurality of bit lines BL and a plurality of memory units identical to the first memory unit 1 (hereinafter regarded to as the first memory units 1). The bit lines BL are parallel to each other and are arranged in the X direction of FIG. 1. The first memory units 1 can be arranged to form a high-density memory unit array with a pattern configured by a plurality of hexagons (as indicated by the reference number 60). However, the shape of each hexagon formed by the first memory units 1 may not be limited to be a regular hexagon (which may be the arrangement providing highest density), and the symmetries of the hexagons formed by the first memory units 1 can be adjusted depending on design needs.

Additionally, by adjusting the distance between the first memory units 1 and the bit line BL in the X direction, the bit line BL will not be adversely affected by the first capacitor 21 or the second capacitor 22.

Figure 2:
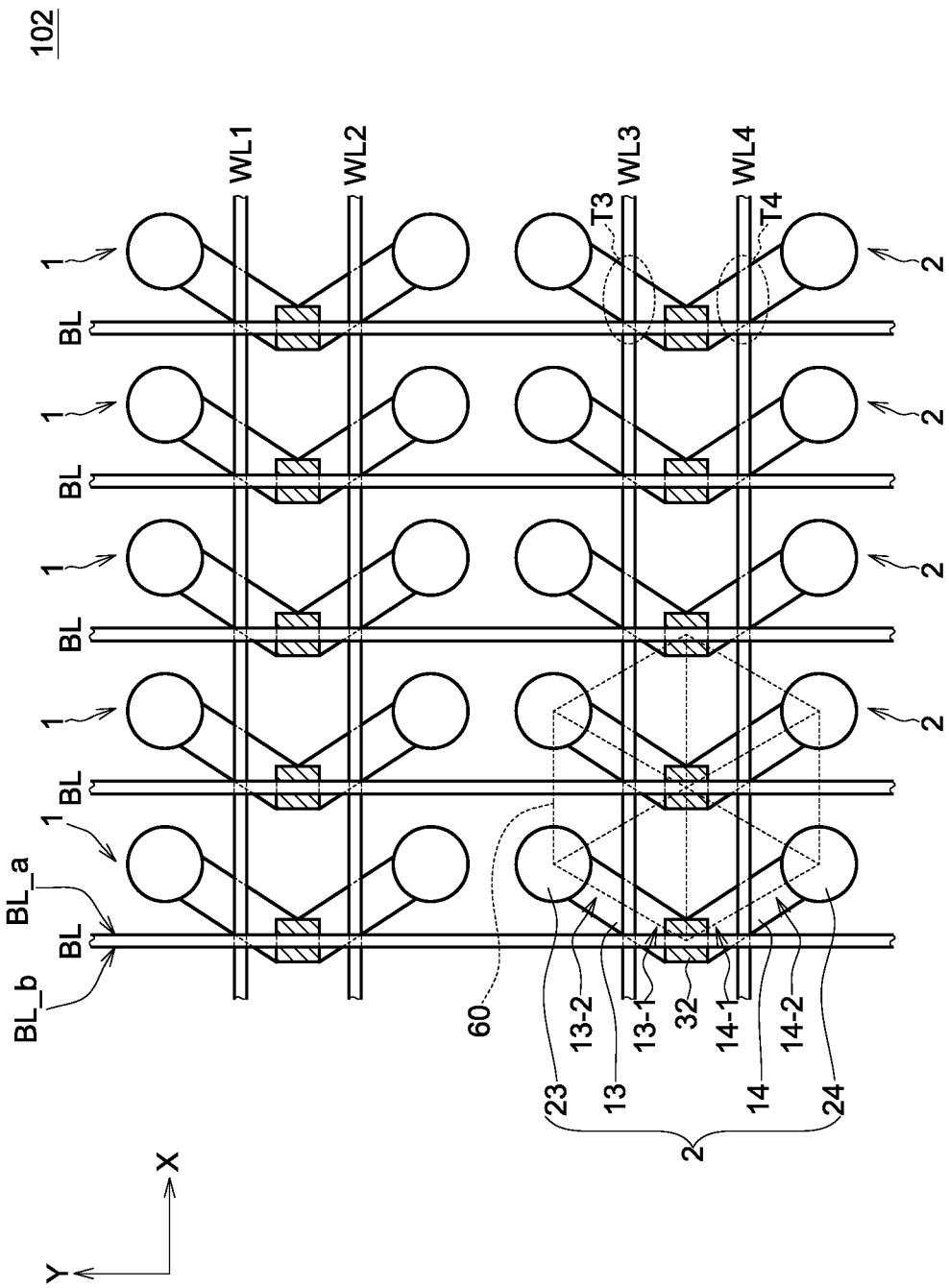
FIG. 2 is a top view of a semiconductor structure according to another embodiment of the invention.

FIG. 2 is a top view of a semiconductor structure 102 according to another embodiment of the invention. Since the elements of the semiconductor structure 102 similar to that of the semiconductor structure 101 has been described above, thus the descriptions thereof will not be redundantly repeated. Similarly, to more clearly illustrate the relationship between some elements of semiconductor structure 102, some other elements may be omitted.

As indicated in FIG. 2, the semiconductor structure 102 includes a substrate (not illustrated), a bit line BL and a first memory unit 1. Moreover, the semiconductor structure 102 further includes a second memory unit 2. The first memory unit 1 and the second memory unit 2 are staggered with each other in the extending direction of the bit line BL (the Y direction of FIG. 2).

In the present embodiment, the second memory unit 2 includes a third transistor T3, a third capacitor 23, a fourth transistor T4 and a fourth capacitor 24. The third transistor T3 is disposed on the substrate and has a fifth terminal 13-1 and a sixth terminal 13-2. The fifth terminal 13-1 connects to the bit line BL. The third capacitor 23 connects the sixth terminal 13-2 of the third transistor T3. The fourth transistor T4 is disposed on the substrate and has a seventh terminal 14-1 and an eighth terminal 14-2. The seventh terminal 14-1 connects to the bit line BL. The fourth capacitor 24 connects the eighth terminal 14-2 of the fourth transistor T4.

Similarly, the third capacitor 23 and the fourth capacitor 24 are separated from the bit line BL in a direction perpendicular to the extending direction of the bit line BL (the X direction). In the present embodiment, the third capacitor 23 and the fourth capacitor 24 are located on the first side BL_a of the bit line BL. That is, the first capacitor 21, the second capacitor 22, the third capacitor 23 and the fourth capacitor 24 are located on the same side of the bit line BL. Furthermore, the active regions of the third transistor T3 and the fourth transistor T4 can be connected and form a "<" shaped structure.

In an embodiment, the semiconductor structure 102 may further include a second bit line contact 32 disposed on the bit line BL. The fifth terminal 13-1 of the third transistor T3 and the seventh terminal 14-1 of the fourth transistor T4 are connected to the second bit line contact 32.

In the present embodiment of the invention, the plurality of word lines of the semiconductor structure may further include a third word line WL3 and a fourth word line WL4. Similarly, the active region of the second memory unit 2 can be divided into a third active region 13 and a fourth active region 14. The third word line WL3 is disposed on the third active region 13 to define the third transistor T3. The fourth word line WL4 is disposed on the fourth active region 14 to define the fourth transistor T4.

In an embodiment, at least two of the plurality of word lines can be located between the first bit line contact 31 and the second bit line contact 32. For example, as depicted in FIG. 2, the second word line WL2 and the third word line WL3 are located between the first bit line contact 31 and the second bit line contact 32.

In the embodiment illustrated in FIG. 2, the semiconductor structure 102 includes a plurality of bit lines BL, a plurality of memory units identical to the first memory unit 1 (hereinafter regarded to as the first memory units 1) and a plurality of memory units identical to the second memory unit 2 (hereinafter regarded to as the second memory units 2). Similarly, the second memory units 2 can be arranged in the form a high-density memory unit array with a pattern configured by a plurality of hexagons (as indicated by the reference number 60). However, the shape of each hexagon formed by the second memory units 2 may not be limited to be a regular hexagon (which may be the arrangement providing highest density), and the symmetries of the hexagons formed by the second memory units 2 can be adjusted depending on design needs.

Figure 3:
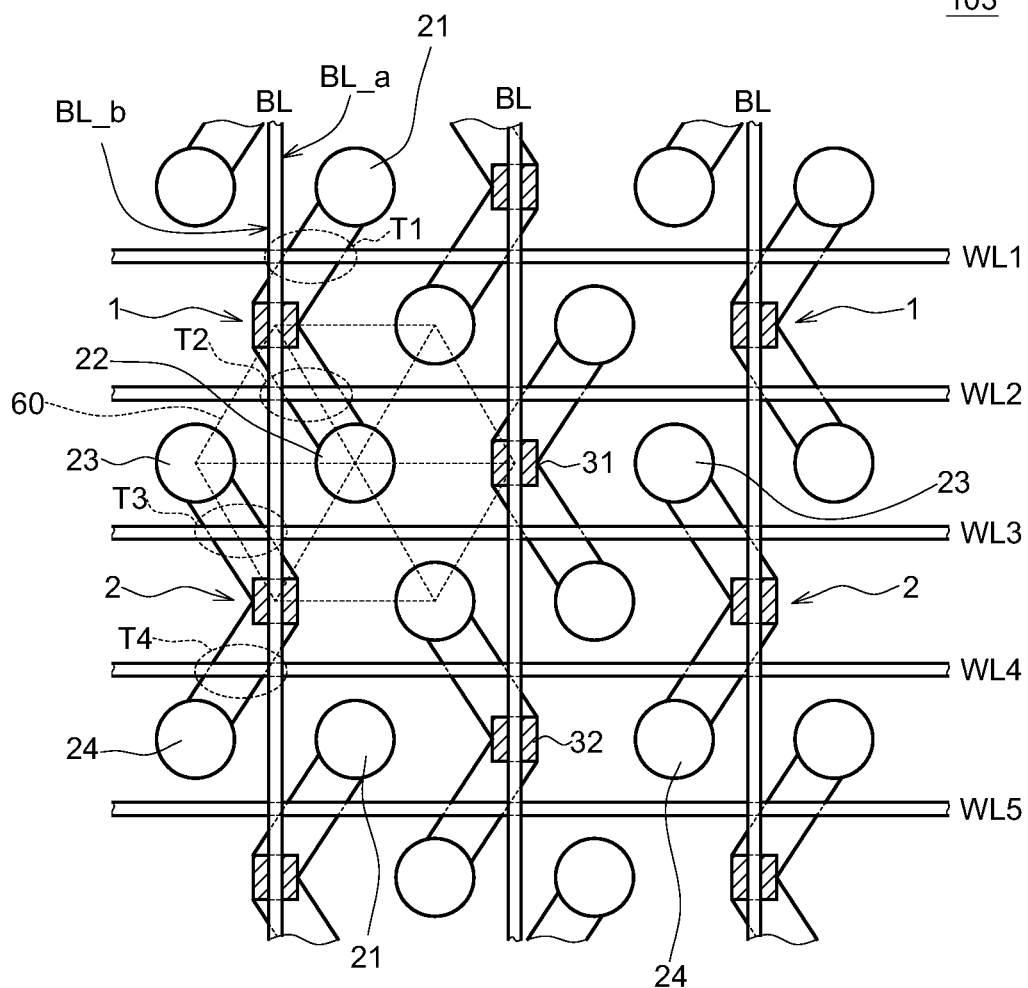
FIG. 3 is a top view of a semiconductor structure according to an alternate embodiment of the invention.

FIG. 3 is a top view of a semiconductor structure 103 according to an alternate embodiment of the invention. The elements of the semiconductor structure 103 are similar to that of the semiconductor structure 102 except for difference between the arrangements of the first memory units 1 and the second memory units 2, and the similarities between the semiconductor structures 102 and 103 thus will not be redundantly repeated here.

As indicated in FIG. 3, the semiconductor structure 103 includes a plurality of first memory units 1 and a plurality of second memory units 2. The first memory units 1 and the second memory units 2 are staggered with each other in the extending direction of the bit line BL. In the present embodiment, the first capacitor 21 and the second capacitor 22 of each first memory unit 1 are located on the first side BL_a of the bit line BL, and the third capacitor 23 and the fourth capacitor 24 of each second memory unit 2 are located on the second side BL_b of the bit line BL. That is, the first capacitor 21 and the second capacitor 22 of each first memory unit 1 and the third capacitor 23 and the fourth capacitor 24 of each second memory unit 2 are respectively located on two sides of the bit line BL.

In the present embodiment, in each first memory unit 1, the active regions of the first transistor T1 and the second transistor T2 can be connected to each other and form a "<" shaped structure; in each second memory unit 2, the active regions of the third transistor T3 and the fourth transistor T4 can be connected to each other and form an inverted "<" shaped structure.

Similarly, the semiconductor structure 103 includes a plurality of word lines. In the embodiment illustrated in FIG. 3, the semiconductor structure 103 includes a first word line WL1, a second word line WL2, a third word line WL3, a fourth word line WL4 and a fifth word line WL5. In an embodiment, at least two of the plurality of word lines can be located between the first bit line contact 31 and the second bit line contact 32. For example, the second word line WL2 and the third word line WL3 are located between the first bit line contact 31 and the second bit line contact 32.

In the present embodiment, two capacitors can be disposed between adjacent two of the plurality of word lines, and the two capacitors are respectively located on the first side BL_a and the second side BL_b of the bit line BL. For example, the second capacitor 22 of the first memory unit 1 and the third capacitor 23 of the second memory unit 2 are located between the second word line WL2 and the third word line WL3; the second capacitor 22 of the first memory unit 1 is located on the first side BL_a of the bit line BL; the third capacitor 23 of the second memory unit 2 is located on the second side BL_b of the bit line B. Or, the fourth capacitor 24 of the second memory unit 2 and the first capacitor 21 of the first memory unit 1 are located between the fourth word line WL4 and the fifth word line WL5; the fourth capacitor 24 of the second memory unit 2 is located on the second side BL_b of the bit line BL; the first capacitor 21 of the first memory unit 1 is located on the first side BL_a of the bit line BL.

Furthermore, the semiconductor structure 103 includes a plurality of bit lines BL each connecting to a plurality of first memory units 1 and a plurality of second memory units 2 respectively. As indicated in FIG. 3, two sides of each bit line contact correspond to a capacitor of the first memory unit 1 and a capacitor of the second memory unit 2 respectively. Let the bit line BL in the middle of FIG. 3 be taken for example. The left side of the first bit line contact 31 corresponds to the second capacitor 22 of a first memory unit 1 and the right side of the first bit line contact 31 corresponds to the third capacitor 23 of a second memory unit 2; the left side of the second bit line contact 32 corresponds to the first capacitor 21 of the first memory unit 1, and the right side of the second bit line contact 32 corresponds to the fourth capacitor 24 of the second memory unit 2.

According to above arrangement, the first memory units 1 and the second memory units 2 are arranged to form a high-density memory unit array with a pattern configured by a plurality of hexagons (as indicated by the reference number 60). Similarly, the shape of each hexagon formed by the first memory units 1 and the second memory units 2 may not be limited to be a regular hexagon (which may be the arrangement providing highest density), and the symmetries of the hexagons formed by the first memory units 1 and the second memory units 2 can be adjusted depending on design needs.

As disclosed in above embodiments, the semiconductor structure of the present disclosure can provide a high-density memory unit array through a specific arrangement of the transistors resulted from the change in the positions and shapes of the transistors.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure characterized in that the semiconductor structure comprises:
    a substrate;
    a bit line disposed on the substrate and having a first side and a second side opposite to the first side;
    a first memory unit, comprising:
        a first transistor disposed on the substrate and having a first terminal and a second terminal, wherein the first terminal connects to the bit line;
        a first capacitor connecting to the second terminal of the first transistor;
        a second transistor disposed on the substrate and having a third terminal and the fourth terminal, wherein the third terminal connects to the bit line; and
        a second capacitor connecting to the fourth terminal of the second transistor;
        wherein the first capacitor and the second capacitor are separated from the bit line in a direction perpendicular to an extending direction of the bit line, and the first capacitor and the second capacitor are located on the first side of the bit line; and
    a second memory unit, comprising:
        a third transistor disposed on the substrate and having a fifth terminal and a sixth terminal, wherein the fifth terminal connects to the bit line;
        a third capacitor connecting to the sixth terminal of the third transistor;
        a fourth transistor disposed on the substrate and having a seventh terminal and an eighth terminal, wherein the seventh terminal connects to the bit line; and
        a fourth capacitor connecting to the eighth terminal of the fourth transistor;
        wherein the third capacitor and the fourth capacitor are separated from the bit line in the direction perpendicular to the extending direction of the bit line, and the third capacitor and the fourth capacitor are located on the second side of the bit line.

2. The semiconductor structure according to claim 1, further comprising:
    a first bit line contact disposed on the bit line;
    wherein the first terminal of the first transistor and the third terminal of the second transistor are connected to the first bit line contact.

3. The semiconductor structure according to claim 2, wherein an active region of the first memory unit is divided into a first active region and a second active region, and the semiconductor structure further comprises:
    a plurality of word lines extended in the direction perpendicular to the extending direction of the bit line, and comprising:
        a first word line disposed on the first active region to define the first transistor; and
        a second word line disposed on the second active region to define the second transistor.

4. The semiconductor structure according to claim 3, wherein an active region of the second memory unit is divided into a third active region and a fourth active region, and the plurality of word lines further comprise:
    a third word line disposed on the third active region to define the third transistor; and
    a fourth word line disposed on the fourth active region to define the fourth transistor.

5. The semiconductor structure according to claim 4, further comprising a plurality of memory units identical to the first memory unit and a plurality of memory units identical to the second memory unit, wherein the memory units identical to the first memory unit and the memory units identical to second memory unit are staggered with each other in the extending direction of the bit line.

6. The semiconductor structure according to claim 4, further comprising:
 a second bit line contact disposed on the bit line;
 wherein the fifth terminal of the third transistor and the seventh terminal of the fourth transistor are connected to the second bit line contact.

7. The semiconductor structure according to claim 6, wherein at least two of the plurality of word lines are located between the first bit line contact and the second bit line contact.

8. The semiconductor structure according to claim 5, wherein two of the capacitors of the memory units identical to the first memory unit and the memory units identical to the second memory unit that are disposed between adjacent two of the plurality word lines are respectively located on the first side and the second side of the bit line.

\* \* \* \* \*